(12) United States Patent
Endo et al.

(10) Patent No.: US 7,718,509 B2
(45) Date of Patent: May 18, 2010

(54) METHOD FOR PRODUCING BONDED WAFER

(75) Inventors: Akihiko Endo, Tokyo (JP); Tatsumi Kusaba, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/473,122

(22) Filed: May 27, 2009

(65) Prior Publication Data

US 2009/0298261 A1 Dec. 3, 2009

(30) Foreign Application Priority Data

Jun. 3, 2008 (JP) .............................. 2008-145359

(51) Int. Cl.
*H01L 21/46* (2006.01)

(52) U.S. Cl. ....................... 438/459; 438/113; 438/528; 438/706; 438/795

(58) Field of Classification Search ................. 438/113, 438/528, 458, 459, 706, 795–799
See application file for complete search history.

(56) References Cited

U.S. PATENT DOCUMENTS

| | | | |
|---|---|---|---|
| 6,566,233 B2 * | 5/2003 | Yokokawa et al. ........... 438/455 |
| 2001/0029072 A1 * | 10/2001 | Kuwahara et al. ........... 438/151 |
| 2005/0014346 A1 * | 1/2005 | Mitani et al. ................. 438/459 |
| 2007/0161199 A1 * | 7/2007 | Morita ........................ 438/311 |
| 2008/0213974 A1 * | 9/2008 | Okuda et al. ................ 438/459 |
| 2008/0248630 A1 * | 10/2008 | Endo et al. .................. 438/459 |

FOREIGN PATENT DOCUMENTS

WO 2005/074033 A1 8/2005

\* cited by examiner

*Primary Examiner*—Savitri Mulpuri
(74) *Attorney, Agent, or Firm*—Townsend and Townsend and Crew LLP

(57) ABSTRACT

A bonded wafer is produced by comprising a step of implanting oxygen ions from a surface of a wafer for active layer to form an oxygen ion implanted layer at a given position inside the wafer for active layer; a step of bonding the wafer of active layer to a wafer for support substrate directly or through an insulating film; a step of subjecting the resulting bonded wafer to a heat treatment for increasing a bonding strength; a step of removing a portion of the wafer for active layer in the bonded wafer to a given position not exposing the oxygen ion implanted layer by a given method; a step of exposing the entire surface of the oxygen ion implanted layer; and a step of removing the exposed oxygen ion implanted layer to obtain an active layer of a given thickness, wherein the step of exposing the entire surface of the oxygen ion implanted layer is carried out by a dry etching under given conditions.

3 Claims, 2 Drawing Sheets

METHOD FOR PRODUCING BONDED WAFER

CROSS REFERENCES TO RELATED APPLICATIONS

This application claims priority to Japanese Patent Application No. 2008-145359, filed Jun. 3, 2008, the disclosure of which is incorporated by reference herein.

BACKGROUND OF THE INVENTION

1. Field of the Invention

This invention relates to a method for producing a bonded wafer, and more particularly to a method for producing a bonded wafer in which an oxygen ion implanted layer is provided on a wafer for active layer as an etching stop layer.

2. Description of the Related Art

The bonded wafer normally means a bonded SOI wafer. As a production method thereof are mentioned, for instance, a method wherein an oxidized wafer for active layer is bonded to a wafer for support substrate and thereafter a surface of the wafer for active layer is thinned to a given thickness by grinding and polishing as disclosed in a literature, "Science of Silicon", edited by USC Semiconductor Substrate Technology Workshop, published by REALIZE INC. on Jun. 28, 1996, pp 459-462, and an ion implantation-isolation method or a so-called smart cut (Smart Cut (registered trademark)) method comprising a step of forming an ion implanted layer by implanting, ions of a light element such as hydrogen, helium or the like into a wafer for active layer at a given depth position, a step of bonding the wafer for active layer to a wafer for support substrate through an insulating film, a step of exfoliating at the ion implanted layer and a step of thinning a portion of the active layer exposed at a state bonded to the wafer for support substrate by exfoliation to form an active layer of a given thickness as disclosed in WO 2005/074033.

In the above silicon wafer, it is assumed that it is important to make the thickness of the active layer thin and to enhance the uniformity thereof. To this end, the inventors have also disclosed the production technique of a bonded wafer satisfying the requirements for the thinning and the uniformity of the thickness of the active layer in WO 2005/074033.

In the technique disclosed in WO 2005/074033, however, when oxygen ions introduced in the oxygen ion implantation (oxygen ion implanted layer) do not form a complete oxide film and is existent at a discontinuous state, an etching solution-penetrates from a portion of the wafer not forming the oxide film to remove the active layer at a subsequent step (at a time of exposing the oxygen ion implanted layer), and hence the thickness uniformity of the active layer may be deteriorated and defects may be caused. Although the deterioration of the thickness uniformity and the occurrence of defects may be reduced at a next oxidation treatment step and at a step of removing an oxide film, it is particularly feared that the defects are further increased at a step of heat treatment.

SUMMARY OF THE INVENTION

It is, therefore, an object of the invention to provide a method for producing a bonded wafer which is capable of ensuring the thickness uniformity of the active layer and preventing the occurrence of defects even when the oxygen ion implanted layer does not form a complete oxide film and is discontinuous.

The summary and construction of the invention for achieving the above object are as follows.

(1) A method for producing a bonded wafer, comprising a step of implanting oxygen ions from a surface of a wafer for active layer to form an oxygen ion implanted layer at a given position inside the wafer for active layer; a step of bonding the wafer of active layer to a wafer for support substrate directly or through an insulating film so as to form a bonded wafer; a step of subjecting the resulting bonded wafer to a heat treatment for increasing a bonding strength; a step of removing a portion of the wafer for active layer in the bonded wafer to a given position not exposing the oxygen ion implanted layer by a given method; a step of exposing the entire surface of the oxygen ion implanted layer; and a step of removing the exposed oxygen ion implanted layer to obtain an active layer of a given thickness, wherein the step of exposing the entire surface of the oxygen ion implanted layer is carried out by a dry etching under given conditions.

(2) A method for producing a bonded wafer according to the item (1), wherein the dry etching is a reactive ion etching using a mixed gas of sulfur hexafluoride, carbon tetrafluoride, trifluoromethane or xenon difluoride, and oxygen or hydrogen chloride as a dry etching gas.

(3) A method for producing a bonded wafer according to the item (1), wherein the oxygen ion implanted layer has an oxygen concentration peak of not less than $1 \times 10^{22}$ atoms/cm$^3$ and satisfies a relationship of $R_e > 2 \times \{(t_s)/(t_o)\} \times \{(D_e + D_t)/(100 - D_e)\}$ when a thickness and a variation in an in-plane thickness of a silicon layer in the wafer for active layer on the oxygen ion implanted layer before the dry etching are $t_s$ and $\pm D_t\%$, respectively, and a thickness of the oxygen ion implanted layer is $t_o$ and an etching rate ratio of Si to silicon oxide film (Si/SiO$_x$) is $R_e$, and a variation in an in-plane etching is $\pm D_e\%$.

(4) A method for producing a bonded wafer according the item (1), wherein a crystal orientation of a bonding face between the wafer for active layer and the wafer for support substrate is <100>, <110> or <111>.

According to the invention, it is possible to provide a method of producing a bonded wafer which is capable of ensuring the thickness uniformity of the active layer and preventing the occurrence of defects even when the oxygen ion implanted layer is discontinuous.

BRIEF DESCRIPTION OF THE DRAWING

The invention will be described with reference to the accompanying drawings, wherein.

DESCRIPTION OF THE PREFERRED EMBODIMENTS

Figure 1:
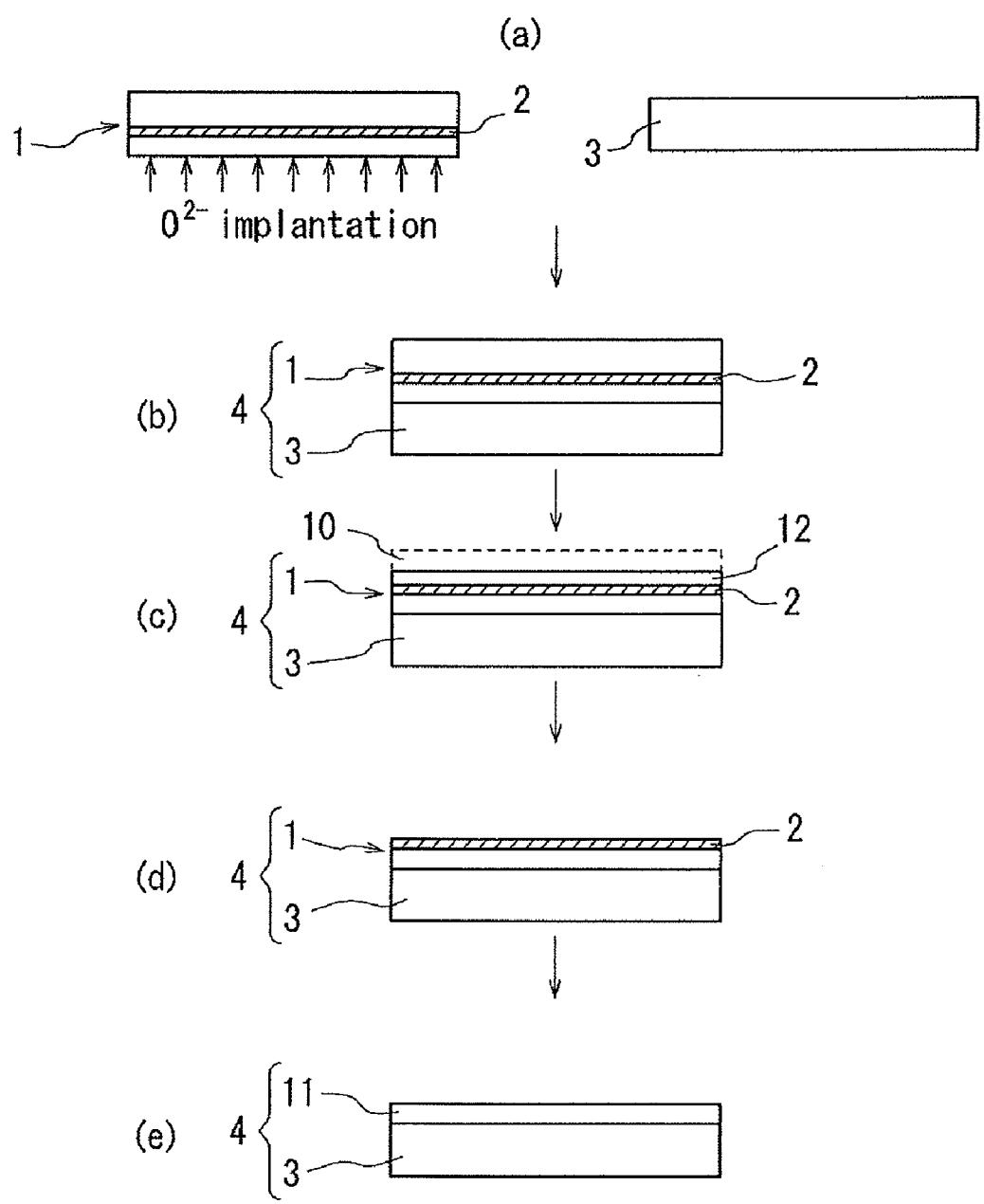
FIG. 1 is a flow chart showing production steps of a bonded wafer according to the invention.

The method for producing a bonded wafer according to the invention will be described with reference to the accompanying drawings. FIG. 1 is a flow chart illustrating each step of the method for producing a bonded wafer according to the invention.

The method for producing a bonded wafer according to the invention comprises a step of implanting oxygen ions from a surface of a wafer for active layer 1 to form an oxygen ion implanted layer 2 at a given position inside the wafer for active layer (FIG. 1(a)); a step of bonding the wafer of active layer 1 to a wafer for support substrate 3 directly or through an insulating film (FIG. 1(b)); a step of subjecting the resulting bonded wafer 4 to a heat treatment for increasing a bonding strength (not shown); a step of removing a portion 10 of the wafer for active layer in the bonded wafer 4 to a given position not exposing the oxygen ion implanted layer, preferably a position of 5 to 15 μm from the oxygen ion implanted layer by a given method (FIG. 1 (c)); a step of exposing the entire surface of the oxygen ion implanted layer 2 (FIG. 1 (d)); and a step of removing the exposed oxygen ion implanted layer 2 to obtain an active layer 11 of a given thickness (FIG. 1(e)).

Moreover, the oxygen ion implanted layer is clearly shown at an exaggeratedly thickened state in the wafer for active layer and at a position close to a central portion of the wafer for active layer in FIG. 1(a) and so on for convenience of explanation, but it is actually existent thinly in the vicinity of the surface of the wafer for active layer implanted with oxygen ions.

Oxygen Ion Implanting Step

The step of implanting oxygen ions according to the invention (FIG. 1(a)) is a step of implanting oxygen ions from the surface of the wafer for active layer 1 to form the oxygen ion implanted layer 2 at a given position inside the wafer for active layer. The oxygen ion implanted layer 2 serves as a polishing stop layer or an etching stop layer in subsequent steps (FIGS. 1(c) and (d)).

The position forming the oxygen ion implanted layer in the wafer for active layer 1 as well as an acceleration voltage and a dose of the oxygen ion implantation accompanied therewith are not particularly limited, and may be properly selected depending on a target thickness of the active layer 11. Preferably, the acceleration voltage is within a range of 100 to 300 keV and the dose of oxygen ions is within a range of $5.0 \times 10^{16}$ to $5.0 \times 10^{17}$ atoms/cm$^2$.

Moreover, the oxygen ion implanted layer 2 is preferable to have an oxygen concentration peak of not less than $1.0 \times 10^{22}$ atoms/cm$^3$. Although oxygen ions in the oxygen ion implanted layer are reacted with Si of the wafer for active layer 1 at a subsequent heat-treating step (not shown) to form $SiO_2$ particles, if the oxygen concentration peak is less than $1.0 \times 10^{22}$ atoms/cm$^3$, the number of $SiO_2$ particles is small and a distance between the $SiO_2$ particles becomes wider to cause a gap, and hence there are generated places not serving as an etching stop layer.

After oxygen ions are implanted from the surface of the wafer for active layer 1 to form the oxygen ion implanted layer 2 at the oxygen ion implantation step, it is preferable to conduct a heat treatment at a temperature of not lower than 1100° C. in a non-oxidizing atmosphere of hydrogen, argon or the like. By this heat treatment is made the form of the oxygen ion implanted layer 2 to a relatively continuous state, which can enhance the function as an etching stop layer.

When the heat-treating temperature is lower than 1100° C., the oxygen ion implanted layer having a sufficient continuity is not formed, and there is a tendency that only the result similar to the case not conducting the heat treatment is obtained, so that the heat-treating temperature is set to not lower than 1100° C. Moreover, the upper limit of the heat-treating temperature is not particularly limited, but is preferable to be not higher than 1250° C. from a viewpoint of a risk of causing slip dislocation.

Bonding Step, Heat-treating Step

The bonding step according to the invention (FIG. 1(b)) is a step of bonding the wafer for active layer 1 to the wafer for support substrate 3 directly or through an insulating film. As the bonded wafer 4 according to the invention supposes both a case of bonding through the insulating film and a case of directly bonding without the insulating film, a method of bonding is not particularly limited.

Furthermore, a crystal orientation of a bonding face between the wafer for active layer 1 and the wafer for support substrate 3 is preferable to be <100>, <110> or <111>. A face perpendicular to these three crystal orientations is a low-order face in a silicon crystal, and is a dense face in which the number of silicon atoms per unit area is highest. In general, when a single crystal is etched, a face anisotropy of an etching rate is developed, and as the face becomes denser, the etching rate becomes slower and hence an etched crystal surface is a surface constituted with the dense face (For instance, in a case of using a silicon wafer having a surface of (113) face, which is not a silicon dense surface, if such a surface is etched, the (113) face disappears with the etching and a face being slow in the etching rate, i.e. a dense face is developed on the surface. Thus, it becomes a rough surface). Although silicon is treated by the dry etching in the invention, if silicon faces other than the aforementioned face are bonded and subjected to the dry etching, a dense face having a small etching rate is gradually produced, and hence the etched face becomes irregular and it is difficult to uniformly etch the entire surface of the oxygen ion implanted layer (etching stop layer).

After the above bonding step (FIG. 1(b)), the bonded wafer 4 is subjected to a heat treatment step (not shown) for increasing a bonding strength. In this heat treatment step, an atmosphere gas is not particularly limited, while it is preferable to conduct the heat treatment at a treating temperature of 1100° C. for a treating time of not less than 60 minutes. When the temperature is lower than 1100° C., the reaction at the bonding interface is hardly promoted and hence a sufficient bonding strength is not obtained. The upper limit of the treating temperature may be about 1350° C. not melting silicon, which increases a risk of causing slip dislocation, but it is preferable to be about 1100 to 1200° C.

Step of Removing an Active Layer

The step of removing an active layer according to the invention (FIG. 1(c)) is a step of removing a portion 10 of the wafer for active layer in the bonded wafer 4 to a given position not exposing the oxygen ion implanted layer 2 by a given method. By removing the portion 10 of the wafer for active layer to the vicinity of the surface of the oxygen ion implanted layer 2, the subsequent step of exposing the oxygen ion implanted layer (FIG. 1(d)) can be conducted efficiently.

The method of removing the portion 10 of the wafer for active layer is not particularly limited, and may be, for example, the removal by grinding or the removal by exfoliation through the smart cut method. The position not exposing the oxygen ion implanted layer 2 is not particularly limited as long as it is a position before the oxygen ion implanted layer 2 is exposed, but it is preferable to be about 5 to 15 μm from the oxygen ion implanted layer 2. When the position exceeds 15 μm, the portion 10 of the wafer for active layer becomes too thick and the subsequent step of exposing the active layer by etching is required to take a long time, while when it is less than 5 μm, there is a fear that the oxygen ion implanted layer 2 may be exposed by an error of the grinding or the like.

Step of Exposing Oxygen Ion Implanted Layer

Figure 2:
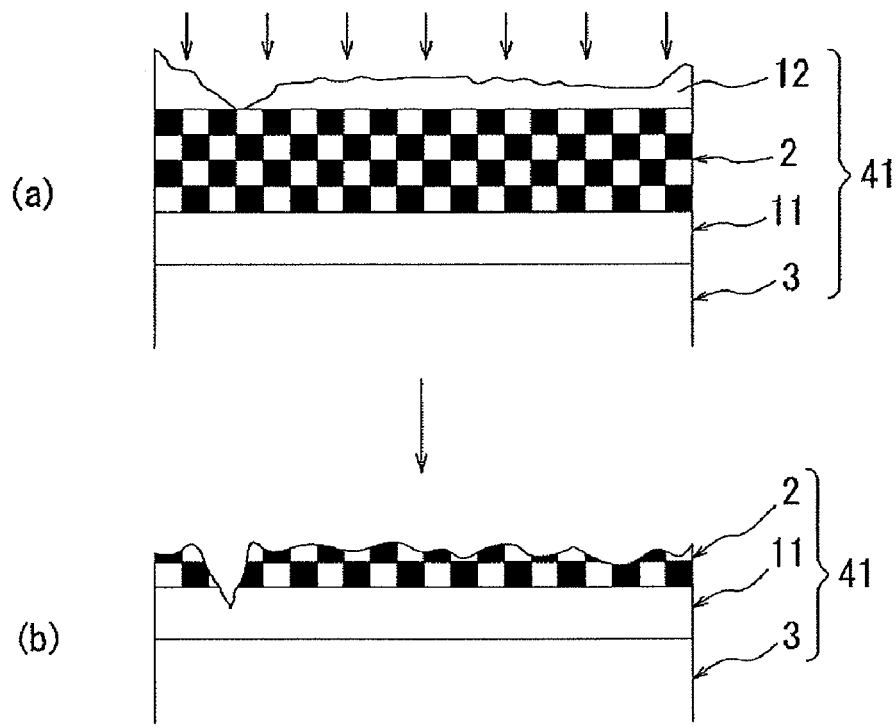
FIG. 2 is a schematic view showing a change in a state of a bonded wafer when the bonded wafer is subjected to a conventional wet etching treatment.

The step of exposing the oxygen ion implanted layer according to the invention (FIG. 1(d)) is a step of exposing the entire surface of the oxygen ion implanted layer 2, which is required to be conducted by dry etching under given conditions. FIG. 2 schematically shows a state that a bonded wafer 41 having a discontinuous oxygen ion implanted layer 2 is subjected to the conventional wet-etching treatment, from which it is seen that an etching solution is passed through gaps between $SiO_2$ in the oxygen ion implanted layer by capillary phenomenon of wet etching to penetrate into an active layer 11 as an underground layer for the oxygen ion implanted layer (FIG. 2(a)), and hence the active layer 11 formed at the subsequent step of removing the oxygen ion implanted layer is partially etched to cause the deterioration of thickness uniformity and occurrence of defects (FIG. 2(b)).

Figure 3:
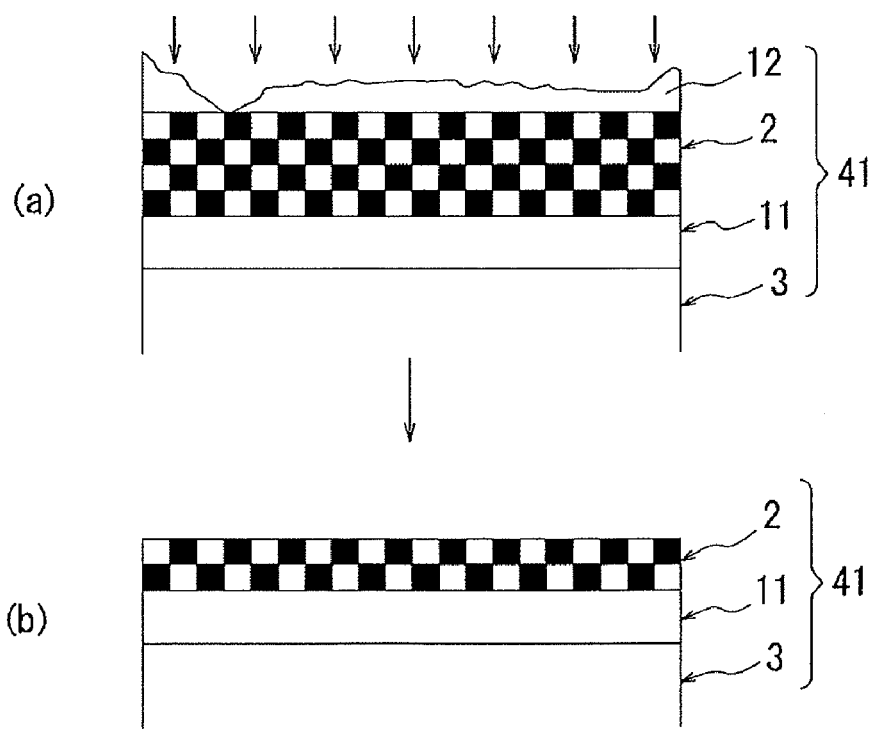
FIG. 3 is a schematic view showing a change in a state of a bonded wafer when the bonded wafer is subjected to a dry etching according to the invention.

On the other hand, FIG. 3 schematically shows a state that a bonded wafer 41 having a discontinuous oxygen ion implanted layer 2 is subjected to a dry-etching treatment as in the invention. In case of using the dry etching, the capillary phenomenon is not caused and an etching gas does not reach the active layer 11 (FIG. 3(a)), and hence by the subsequent step of removing the oxygen ion implanted layer (FIG. 3(b)) can be exposed the entire surface of the oxygen ion implanted layer 2 without exposing the active layer 11 as an underground layer, whereby there can be formed the active layer 11 being less in the occurrence of defects and excellent in the thickness uniformity.

Moreover, the dry etching is preferable to be a reactive ion etching using a mixed gas of sulfur hexafluoride, carbon tetrafluoride, trifluoromethane or xenon difluoride, and oxygen or hydrochloric gas as a dry etching gas. Since the reactive ion etching is an anisotropic etching, even if there are many gaps between $SiO_2$, when the active layer 11 is covered with the oxygen ion implanted layer 2 viewing from an upper face of the bonded wafer 4 before the etching, the etching gas does not reach the active layer 11. Furthermore, it is more preferable that the ion speed of the reactive gas can be aligned in form of beams and irradiated straightly to the bonded wafer 4 to thereby conduct highly accurate and delicate anisotropic etching.

Also, the etching gas used in the dry etching is preferable to satisfy the following equation (1):

$$R_e > 2 \times \{(t_s)/(t_o)\} \times \{(D_e+D_t)/(100-D_e)\} \quad (1)$$

when a thickness and a variation in an in-plane thickness of a silicon layer in the wafer for active layer on the oxygen ion implanted layer before the dry etching are $t_s$ and $\pm D_t\%$, respectively, and a thickness of the oxygen ion implanted layer is $t_o$ and an etching rate ratio of Si to silicon oxide film ($Si/SiO_x$) is $R_e$, and a variation in an in-plane etching is $\pm D_e\%$. The thickness of the silicon layer 12 above the oxygen ion implanted layer 2 before the dry etching is not necessarily uniform, for instance, in case of thinning by grinding or in case of generating variation in in-plane thickness or the like, and also the variation in grinding and dry etching is typically about ±5%, so that a portion of the silicon layer 12 may be first etched to expose the oxygen ion implanted layer 2 or there is a fear that the oxygen ion implanted layer 2 is partially removed before the exposure of its entire surface depending on conditions of the etching gas to expose the active layer 11 and hence the variation in in-plane thickness and occurrence of defects may be caused. Therefore, when the etching gas satisfies the above relationship, even if there is a variation of about ±5% in the silicon layer 12 on the oxygen ion implanted layer 2, the partial removal of the oxygen ion implanted layer 2 can be prevented.

The reasons of providing the above equation (1) will be mentioned below. When the etching rate of silicon is $R_s$ and the etching rate of the oxygen ion implanted layer is $R_o$, the election ratio $R_e$ is expressed by the following equation:

Election ratio $R_e = R_s/R_o$

Since the dry etching speed is maximum at a place (A) where the thickness of the silicon layer on the oxygen ion implanted layer is thinnest after grinding, a time $T_a$ till an upper face of the oxygen ion implanted layer is exposed at the place (A) is expressed by the following equation (2):

$$T_a = t_s(100-D_s)/R_s(100+D_r) \quad (2)$$

Wherein $D_s$ is a variation in the thickness of the silicon layer and $D_r$ is a variation in the dry etching. At this time, when the dry etching speed is minimum at a place (B) where the thickness of the silicon layer on the oxygen ion implanted layer is thickest after grinding, the thickness of the residual silicon ($t_{bs}$) when being etched for the time $t_a$ is expressed by the following equation (3):

$$t_{bs} = t_s(100+D_s) - T_a \times R_s(1-D_r) \quad (3)$$

Thereafter, a time $T_b$ till the upper face of the oxygen ion implanted layer is exposed at the place B is expressed by the following equation:

$$T_b = t_{bs}/R_s(100-D_r) = \{t_s(100+D_s)(100+D_r) - t_s(100-D_s)(100-D_r)\}/R_s(100-D_r)(100+D_r)\}$$

The amount of etching the oxygen ion implanted layer ($t_{bo}$) at the place (A) for the time $T_b$ is expressed by the following equation (4):

$$t_{bo} = T_b \times R_o(100+D_r) = t_{sx}(R_o/R_s) \times 2(D_r+D_s)/(100-D_r) \quad (4)$$

Then, in order to stop the dry etching before SOI layer, the above-mentioned etching amount of the oxygen ion implanted layer ($t_{bo}$) is required to be smaller than the initial thickness of the oxygen ion implanted layer ($t_o$), so that it is required to satisfy the following equation (5):

$$t_{bo} < t_o \quad (5)$$

Further, when the equation (5) is expressed in terms of a relation with $R_e$, the following equation (1) is obtained:

$$R_e > 2 \times \{(t_s)/(t_o)\} \times \{(D_e+D_t)/(100-D_e)\} \quad (1)$$

Therefore, when the equation (1) is satisfied, even if the silicon layer 12 on the oxygen ion implanted layer 2 has a variation of about ±5%, it is possible to prevent the partial removal of the oxygen ion implanted layer 2.

Step of Exposing Active Layer

The step of exposing the active layer according to the invention (FIG. 1(e)) is a step of removing the exposed oxygen ion implanted layer 2 to obtain the active layer 11 with a given thickness. The method of removing the oxygen ion implanted layer 2 is not particularly limited and can be carried out by cleaning with HF solution, or by gas etching with a hydrogen gas, an argon gas, a HF-containing gas or the like. The thinning is adjusted so as to render the thickness of the active layer 11 into various thickness in accordance with applications.

Moreover, it is preferable that the thinned bonded wafer 4 is subjected to a heat treatment at a temperature of not higher than 1100° C. in a non-oxidizing atmosphere of hydrogen, argon gas or the like. By this heat treatment is attained a further planarization and also an oxide retaining in the bonded interface can be removed. This effect is remarkable when the thickness of the insulating film is not more than 50 nm or when silicon wafers are directly bonded to each other without the insulating film. Although the planarization is promoted even at the heat-treating temperature of higher than 1100° C., it is important to make the heat-treating temperature to not higher than 1100° C. considering the thickness uniformity of the active layer and the effect of removing residues in the bonded interface. That is, when the temperature exceeds 1100° C., the etching of the active layer is promoted and hence there is a possibility of deteriorating the thickness uniformity, and also as the temperature becomes higher, there is a fear that the oxide retaining in the bonded interface is easily diffused into the side of the active layer 11 to locally etch the active layer 11 and hence pitted defects are caused in the surface thereof.

Although the above is described with respect to only one embodiment of the invention, various modifications may be made without departing from the scope of the appended claims.

EXAMPLE 1

There are provided two P-type (100) silicon wafers with a diameter of 300 mm each sliced from a silicon ingot grown by CZ method and doped with boron, and oxygen ions are implanted twice from a surface of a silicon wafer for active layer under first conditions that an acceleration voltage is 200 keV and a temperature is 200 to 600° C. and a dose is $3.0 \times 10^{17}$ atoms/cm$^2$ and second conditions that an acceleration voltage is 200 keV and a temperature is not higher than 300° C. and a dose is $5.0 \times 10^{15}$ atoms/cm$^2$. As a result, an oxygen ion implanted layer is formed at a depth position of about 400 nm from the surface of the wafer for active layer. Next, the wafer for active layer and a wafer for support substrate are cleaned with HF and ozone solution to remove particles from surfaces to be bonded, and then bonded directly to each other. Thereafter, the bonded wafer is subjected to a heat treatment at 1100° C. in an oxidizing gas atmosphere for 2 hours for strongly bonding the bonded interface. The reby, an oxide film having a thickness of 300 to 500 nm is formed on a rear face of the bonded wafer. Then, a grinding treatment is carried out so as to leave a silicon layer (thickness: about 10 μm) in the wafer for active layer on the surface side of the oxygen ion implanted layer with a grinding apparatus. In this case, a variation in the thickness of the silicon layer is $D_s=\pm 10\%$. Next, an entire surface of the oxygen ion implanted layer is exposed by dry etching with a mixed gas of $CF_4$ and $O_2$ (volume ratio of 3:1), in which an etching rate ratio of Si to silicon oxide film is 40, at an etching temperature of 20° C. In this case, a variation in dry etching is $D_r=\pm 10\%$. Moreover, a value of $R_e$ obtained from $2 \times \{(t_s)/(t_o)\} \times \{(D_e+D_r)/(100-D_e)\}$ is 30.

EXAMPLE 2

A bonded wafer as a sample is obtained in the same steps as in Example 1 except that the grinding treatment is carried out so as to leave a silicon layer (thickness: about 10 μm) on the surface side of the oxygen ion implanted layer with the grinding apparatus and the entire surface of the oxygen ion implanted layer is exposed by dry etching with a mixed gas of $CF_4$ and $O_2$ in which an etching rate ratio of Si to silicon oxide film is 30. Moreover, a value obtained from the equation (1) is 30.

EXAMPLE 3

A bonded wafer as a sample is obtained in the same steps as in Example 1 except that the grinding treatment is carried out so as to leave a silicon layer (thickness: about 5 μm) on the surface side of the oxygen ion implanted layer with the grinding apparatus and the entire surface of the oxygen ion implanted layer is exposed by dry etching with a mixed gas of $CF_4$ and $O_2$ in which an etching rate ratio of Si to silicon oxide film is 30. Moreover, a value obtained from the equation (1) is 15.

EXAMPLE 4

A bonded wafer as a sample is obtained in the same steps as in Example 1 except that the grinding treatment is carried out so as to leave a silicon layer (thickness: about 5 μm) on the surface side of the oxygen ion implanted layer with the grinding apparatus and the entire surface of the oxygen ion implanted layer is exposed by dry etching with a mixed gas of $CF_4$ and $O_2$ in which an etching rate ratio of Si to silicon oxide film is 20. Moreover, a value obtained from the equation (1) is 15.

EXAMPLE 5

A bonded wafer as a sample is obtained in the same steps as in Example 1 except that the grinding treatment is carried out so as to leave a silicon layer (thickness: about 10 μm) on the surface side of the oxygen ion implanted layer with the grinding apparatus and the entire surface of the oxygen ion implanted layer is exposed by dry etching with a mixed gas of $CF_4$ and $O_2$ in which an etching rate ratio of Si to silicon oxide film is 20. Moreover, a value obtained from the equation (1) is 30.

COMPARATIVE EXAMPLE 1

A bonded wafer as a sample is obtained in the same steps as in Example 1 except that the entire surface of the oxygen ion implanted layer is exposed by wet etching with an aqueous KOH solution having an etching rate ratio of Si to silicon oxide film of not less than 200 for 30 minutes. Moreover, a value obtained from the equation (1) is 30.

Evaluation Method

With respect to each sample wafer obtained from Examples and Comparative Example, the presence or the absence of the exposure of the active layer at a time of exposing the oxygen ion implanted layer is visually observed under a fluorescent light. Thereafter, the sample wafer is subjected to thermal oxidization (at 1000° C. for 1 hour) and HF cleaning (with 7% HF solution for 20 minutes) to remove the oxygen ion implanted layer and then to a heat treatment in an argon gas atmosphere at 1100° C. for 1 hour, and then the thickness uniformity (nm) of the active layers is measured by a spectroellipsometer. The results are shown in Table 1.

TABLE 1

| | Thickness of oxygen ion implanted layer (μm) | Thickness of silicon layer on oxygen ion implanted layer (μm) | Etching type | Etching rate ratio (Si/SiO$_2$) | Value from equation (1)* | Exposure of active layer | Thickness uniformity (nm) |
|---|---|---|---|---|---|---|---|
| Example 1 | 0.15 | 10 | Dry etching | 40 | 30 | none | 9 |
| Example 2 | 0.15 | 10 | Dry etching | 30 | 30 | none | 10 |
| Example 3 | 0.15 | 5 | Dry etching | 30 | 15 | none | 7 |

TABLE 1-continued

|  | Thickness of oxygen ion implanted layer (μm) | Thickness of silicon layer on oxygen ion implanted layer (μm) | Etching type | Etching rate ratio (Si/SiO$_2$) | Value from equation (1)* | Exposure of active layer | Thickness uniformity (nm) |
|---|---|---|---|---|---|---|---|
| Example 4 | 0.15 | 5 | Dry etching | 20 | 15 | none | 8 |
| Example 5 | 0.15 | 10 | Dry etching | 20 | 30 | Partially exposed | >100 |
| Comparative Example 1 | 0.15 | 10 | Wet etching | 200 | 30 | Active layer disappeared | — |

*Equation (1) is $2 \times \{(t_s)/(t_o)\} \times \{(D_e + D_t)/(100 - D_e)\}$

As seen from the results of Table 1 on Examples 1 to 4, there is no exposure of the active layer as an underground layer at the step of exposing the oxygen ion implanted layer, and then the thickness uniformity of the active layer is attained even after the removal of the oxygen ion implanted layer. On the other hand, in Example 5, since the Si/SiO$_2$ etching rate ratio is smaller than the preferable election ratio R$_e$ obtained from the equation (1), a part of the active layer is exposed at the step of exposing the oxygen ion implanted layer and hence the thickness uniformity of the active layer is somewhat poor as compared with those of Examples 1 to 4. In the wet etching of Comparative Example 1, as a result of repeating a cycle that a silicon portion in the oxygen ion implanted layer 2 is dissolved by the wet etching to separate off SiO$_2$ particles from the oxygen ion implanted layer and further a new silicon portion is exposed and dissolved, all of the oxygen ion implanted layer 2 disappears and hence the active layer 11 disappears. From the above results, it is understood that the dry etching is effective than the wet etching, and further the dry etching under conditions satisfying the equation (1) is more effective.

According to the invention, it is possible to provide a method of producing a bonded wafer which is capable of ensuring the thickness uniformity of the active layer and preventing the occurrence of defects even when the oxygen ion implanted layer is discontinuous.

What is claimed is:

1. A method for producing a bonded wafer, comprising a step of implanting oxygen ions from a surface of a wafer for active layer to form an oxygen ion implanted layer at a given position inside the wafer for active layer; a step of bonding the wafer of active layer to a wafer for support substrate directly or through an insulating film so as to form a bonded wasfer; a step of subjecting the resulting bonded wafer to a heat treatment for increasing a bonding strength; a step of removing a portion of the wafer for active layer in the bonded wafer to a given position not exposing the oxygen ion implanted layer by a given method; a step of exposing the entire surface of the oxygen ion implanted layer; and a step of removing the exposed oxygen ion implanted layer to obtain an active layer of a given thickness, wherein the step of exposing the entire surface of the oxygen ion implanted layer is carried out by a dry etching under given conditions wherein the oxygen ion implanted layer has an oxygen concentration peak of not less than $1 \times 10^{22}$ atoms/cm$^3$ and satisfies a relationship of $R_e > 2 \times \{(t_s)/(t_o)\} \times \{(D_e + D_t)/(100 - D_e)\}$ when a thickness and a variation in an in-plane thickness of a silicon layer in the wafer for active layer on the oxygen ion implanted layer before the dry etching are $t_s$ and $\pm D_t$ %, respectively, and a thickness of the oxygen ion implanted layer is $t_o$ and an etching rate ratio of Si to silicon oxide film (Si/SiO$_x$) is $R_e$ and a variation in an in-plane etching is $\pm D_e$ %.

2. A method for producing a bonded wafer according to claim 1, wherein the dry etching is a reactive ion etching using a mixed gas of sulfur hexafluoride, carbon tetrafluoride, trifluoromethane or xenon difluoride, and oxygen or hydrogen chloride as a dry etching gas.

3. A method for producing a bonded wafer according to claim 1, wherein a crystal orientation of a bonding face between the wafer for active layer and the wafer for support substrate is <100>, <110> or <111>.

* * * * *